(12) United States Patent
Brown

(10) Patent No.: US 6,921,935 B2
(45) Date of Patent: Jul. 26, 2005

(54) MEMORY CELL AND METHOD FOR FORMING THE SAME

(75) Inventor: Kris K. Brown, Garden City, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/855,705

(22) Filed: May 26, 2004

(65) Prior Publication Data

US 2004/0219742 A1 Nov. 4, 2004

Related U.S. Application Data

(60) Continuation of application No. 10/643,269, filed on Aug. 18, 2003, now Pat. No. 6,797,573, which is a division of application No. 10/177,228, filed on Jun. 21, 2002, now Pat. No. 6,756,625.

(51) Int. Cl.[7] .................... H01L 27/108; H01L 29/76; H01L 29/94; H01L 31/119
(52) U.S. Cl. .................... 257/300; 257/407; 257/412
(58) Field of Search ................. 257/300, 302, 257/327, 329, 330, 334, 343, 378, 407, 412, 389

(56) References Cited

U.S. PATENT DOCUMENTS

| | | | |
|---|---|---|---|
| 4,881,105 A | 11/1989 | Davari et al. ............. 357/23.4 |
| 5,158,901 A | 10/1992 | Kosa et al. .................... 437/40 |
| 5,497,017 A | 3/1996 | Gonzales ..................... 257/306 |
| 5,753,555 A | 5/1998 | Hada .......................... 438/300 |
| 6,097,065 A | 8/2000 | Forbes et al. ............... 257/350 |
| 6,100,123 A | 8/2000 | Bracchitta et al. .......... 438/199 |
| 6,477,080 B2 | 11/2002 | Noble ......................... 365/154 |
| 6,492,662 B2 | 12/2002 | Hsu et al. .................... 257/124 |
| 6,504,201 B1 | 1/2003 | Noble et al. ................ 257/302 |
| 6,511,884 B1 | 1/2003 | Quek et al. ................. 438/268 |
| 6,518,112 B2 | 2/2003 | Armacost et al. ........... 438/212 |
| 6,570,200 B1 | 5/2003 | Yoon .......................... 257/288 |
| 6,756,625 B2 * | 6/2004 | Brown ....................... 257/300 |

* cited by examiner

Primary Examiner—Phuc T. Dang
(74) Attorney, Agent, or Firm—Dorsey & Whitney LLP

(57) ABSTRACT

A semiconductor memory cell structure and method for forming the same. The memory cell is formed on a surface of a substrate and includes an active region formed in the substrate, an epitaxial post formed on the surface of the substrate over the active region. The epitaxial post has at least one surface extending outwardly from the surface of the substrate and another surface opposite of the surface of the substrate. A gate structure is formed adjacent to at least a portion of all the outwardly extending surfaces of the epitaxial post, and a capacitor formed on an exposed surface of the epitaxial post.

31 Claims, 8 Drawing Sheets

MEMORY CELL AND METHOD FOR FORMING THE SAME

CROSS-REFERENCE TO RELATED APPLICATION

This application is a continuation of U.S. patent application Ser. No. 10/643,269, filed Aug. 18, 2003, now U.S. Pat. No. 6,797,573 which is a divisional of U.S. patent application Ser. No. 10/177,228, filed Jun. 21, 2002 now U.S. Pat. No. 6,756,675.

TECHNICAL FIELD

The present invention relates in general to memory circuits, and more particularly, to dynamic random access memory cells and a method for forming the same.

BACKGROUND OF THE INVENTION

Random access memory ("RAM") cell densities have increased dramatically with each generation of new designs and have served as one of the principal technology drivers for ultra large scale integration ("ULSI") in integrated circuit ("IC") manufacturing. However, in order to accommodate continuing consumer demand for integrated circuits that perform the same or additional functions and yet have a reduced size as compared with available circuits, circuit designers continually search for ways to reduce the size of the memory arrays within these circuits without sacrificing array performance.

With respect to memory ICs, the area required for each memory cell in a memory array partially determines the capacity of a memory IC. This area is a function of the number of elements in each memory cell and the size of each of the elements. For example, FIG. 1 illustrates an array 100 of memory cells 110 for a conventional dynamic random access memory (DRAM) device. Memory cells 110 such as these are typically formed in adjacent pairs, where each pair is formed in a common active region 120 and share a common source/drain region that is connected to a respective digit line via a digit line contact 124. The area of the memory cells 110 are said to be $8F^2$, where F represents a minimum feature size for photolithographically-defined features. For conventional $8F^2$ memory cells, the dimension of the cell area is 2F×4F. The dimensions of a conventional $8F^2$ memory cell are measured along a first axis from the center of a shared digit line contact 124 (½F), across a word line 128 that represents an access transistor (1F), a storage capacitor 132 (1F), an adjacent word line 136 (1F), and half of an isolation region 140 (½F) separating the active region 120 of an adjacent pair of memory cells (i.e., resulting in a total of 4F). The dimensions along a second perpendicular axis are half of an isolation region 150 on one side of the active region 120 (½F), the digit line contact 124 (1F), and half of another isolation region 154 on the other side of the active region 120 (½F) (i.e., resulting in a total of 2F).

In some state-of-the-art memory devices, the memory cells for megabit DRAM have cell areas approaching $6F^2$. Although this is approximately a 25% improvement in memory cell area relative to conventional $8F^2$ memory cells, as previously described, a further reduction in memory cell size is still desirable. Therefore, there is a need for a compact memory cell structure and method for forming the same.

SUMMARY OF THE INVENTION

The present invention is directed to a semiconductor memory cell structure. The memory cell is formed on a surface of a substrate and includes an active region formed in the substrate, an epitaxial post formed on the surface of the substrate over the active region. The epitaxial post has at least one surface extending outwardly from the surface of the substrate and another surface opposite of the surface of the substrate. A vertical transistor is formed in the epitaxial post having a gate structure that is formed adjacent to at least a portion of all the outwardly extending surfaces of the epitaxial post. The memory cell further includes a memory cell capacitor formed on an exposed surface of the epitaxial post.

As is conventional in the field of integrated circuit representation, the lateral sizes and thicknesses of the various layers are not drawn to scale, and portions of the various layers may have been arbitrarily enlarged or reduced to improve drawing legibility.

DETAILED DESCRIPTION OF THE INVENTION

Figure 1:
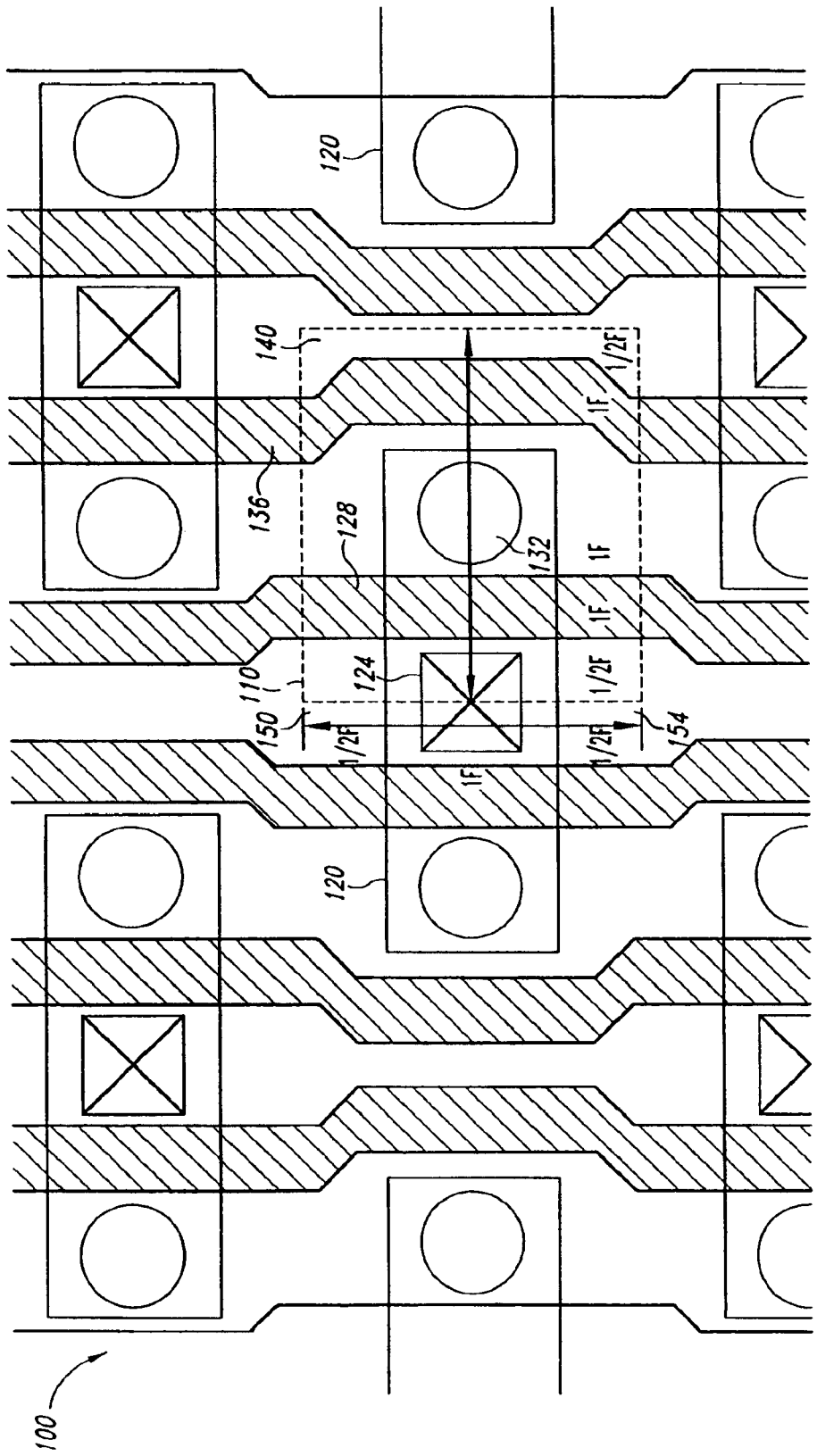
FIG. 1 is a simplified top plan view of conventional memory cells.
Figure 2A:
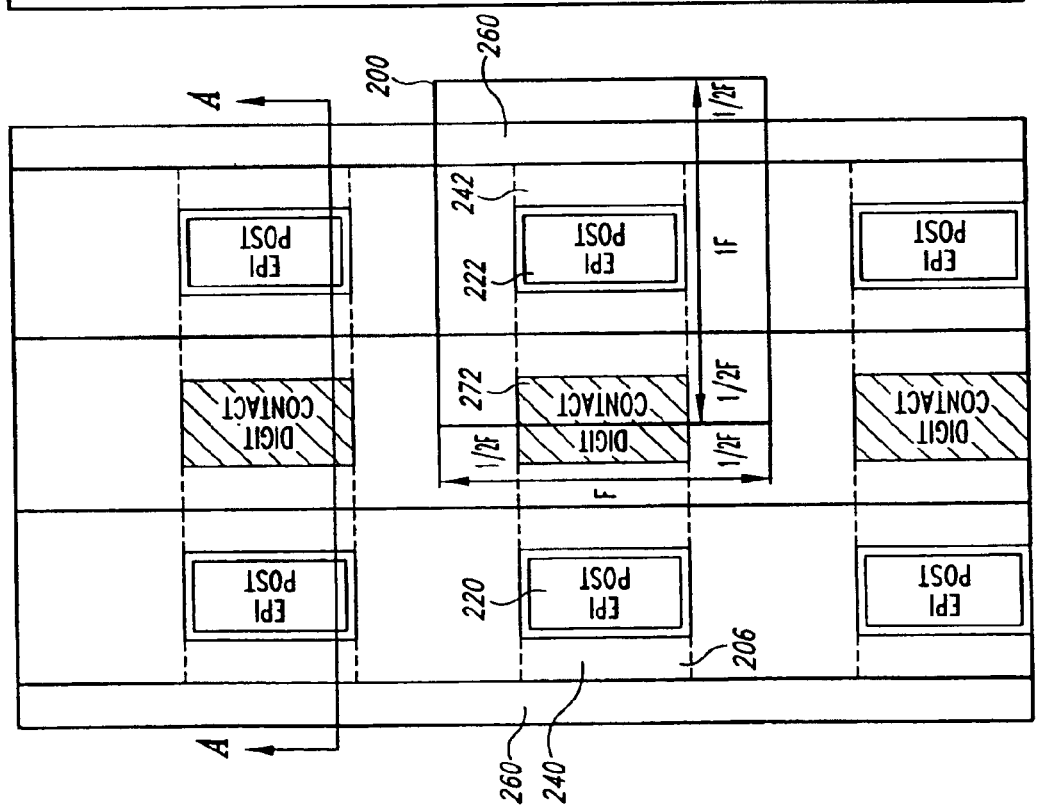
FIG. 2A is a simplified top plan view of memory cells according to an embodiment of the present invention.
Figure 2B:
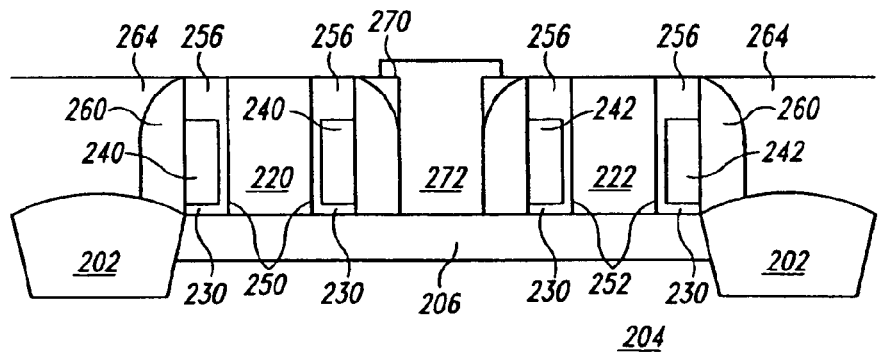
FIG. 2B is a simplified cross-sectional view of a pair of memory cells according to the embodiment shown in FIG. 2A.

FIG. 2A is a top plan view of an array of memory cells 200 according to an embodiment of the present invention. As shown in FIG. 2A, capacitors have not been illustrated in order to avoid unnecessarily obscuring the other structures of the memory cell 200. The dimensions of the cell 200 are $4F^2$. That is, the cell 200 measures 2F along a first axis, starting with half of a digit line contact (½F), and extending over an epitaxial post on which a capacitor is formed (1F) and half of an isolation region (½F). Along a second perpendicular axis, the cell 200 measures 2F, starting with half of an isolation region (½F), and extending over the digit line contact (1F), and half of another isolation region (½F). FIG. 2B is a simplified cross-sectional view of the memory cell 200 (FIG. 2A) along A—A at a stage of processing. A more detailed description of the memory cell 200 will be provided with respect to FIGS. 3 through 10, which illustrate the memory cell 200 at various stages of processing.

Figure 3:
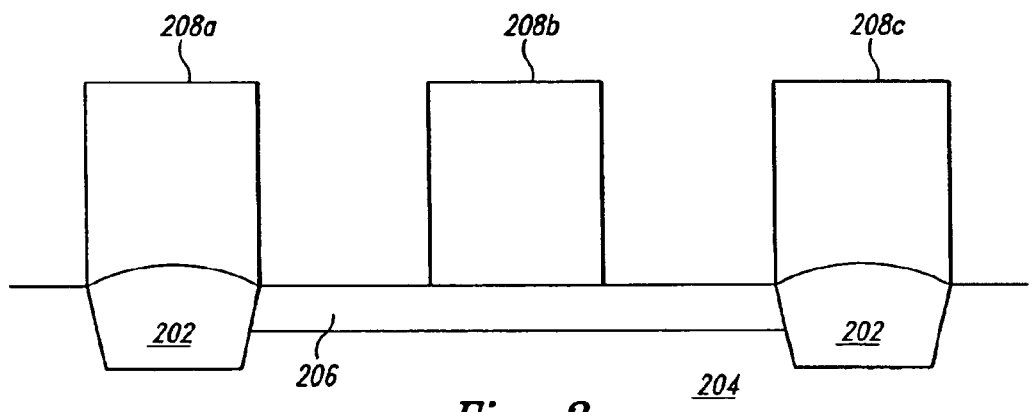
FIG. 3 is a simplified cross-sectional view of a semiconductor substrate that can be processed to form the memory cell of FIG. 2, in accordance with an embodiment of the present invention.

FIG. 3 is a simplified cross-sectional view of the memory cell 200 (FIG. 2) at a stage of processing. Formed in a p-type substrate 204 is an n-type active region 206 in which a pair of memory cells 200 are formed. The active region 206 is isolated from adjacent active regions by isolation regions 202. The active region 206 and the isolation regions 202 can be formed using conventional methods, for example, conventional masking, deposition, implant and drive-in processes. Following the formation of the isolation regions 202 and the active region 206, a layer of insulating material is deposited onto the substrate 204, masked and etched to form sacrificial structures 208*a–c* on the substrate 204. The insulating material from which the sacrificial structures 208*a–c* are formed is silicon nitride, or alternatively, as will be explained in more detail below, other insulating material to which subsequent etch processes are selective.

Figure 4:
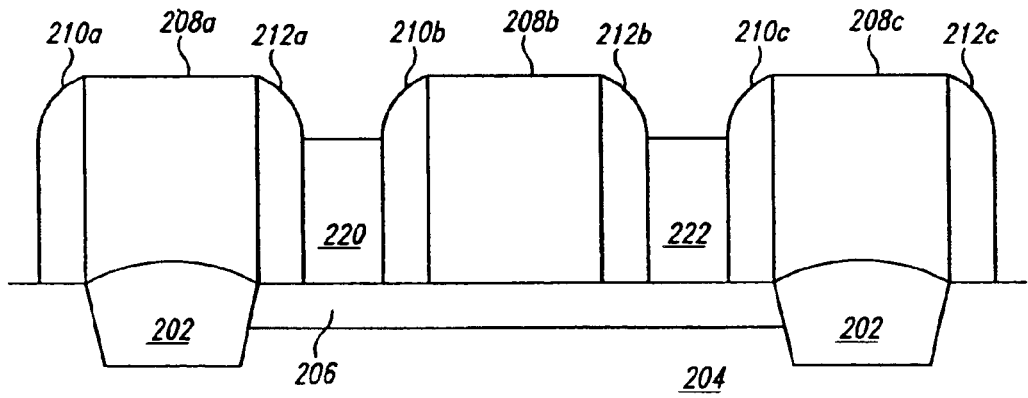
FIG. 4 is a simplified cross-sectional view of the substrate of FIG. 3 at a later point in processing, in accordance with an embodiment of the present invention.

FIG. 4 is a simplified cross-sectional view of the structure shown in FIG. 3 at a later point in processing, in accordance with an embodiment of the present invention. An insulating material is deposited over the substrate 204 and the sacrificial structures 208*a–c* and subsequently etched back using an anisotropic etch process. Suitable etch processes are known in the art. Sidewalls 210*a–c*, 212*a–c* are formed as a result of the deposition and etch back processes. The insulating layer can be formed from a silicon-oxide material, and the etch back process should be selective to the silicon nitride of the sacrificial structures 208*a–c*. A p-type epitaxial layer is formed on the exposed regions of the substrate 204, and etched to selectively form epitaxial "posts" 220, 222 within the trench region between the sacrificial nitride structures 208*a*, 208*b*, and 208*b*, 208*c*, respectively. As will be described in more detail below, the epitaxial posts 220, 222 represent the material in which vertical access transistors (i.e., word lines) will be formed and to which memory cell capacitors are electrically coupled.

Figure 5:
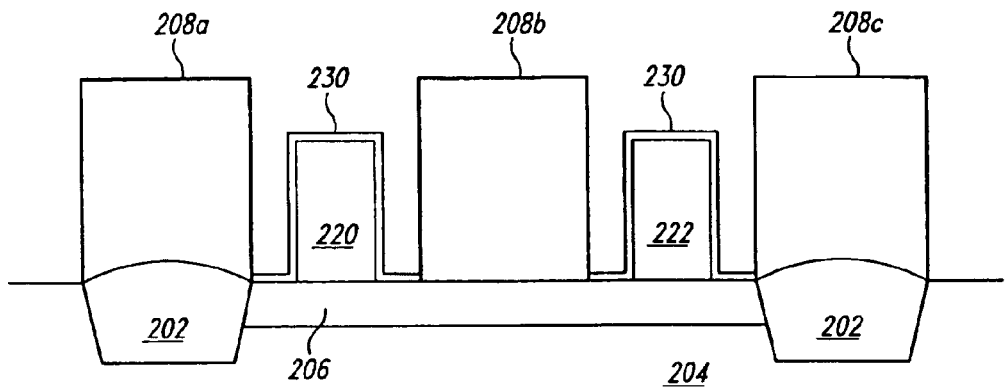
FIG. 5 is a simplified cross-sectional view of the substrate of FIG. 4 at a later point in processing, in accordance with an embodiment of the present invention.

FIG. 5 is a simplified cross-sectional view of the structure shown in FIG. 4 at a later point in processing, in accordance with an embodiment of the present invention. An etch process selective to the nitride sacrificial structures 208*a–c* and the epitaxial posts 220, 222 is performed to remove the oxide sidewalls 210*a–c*, 212*a–c*. Gate oxide 230 is then formed over the epitaxial posts 220, 222 and the exposed regions of the substrate 204. The material of the sacrificial structures 208*a–c* is such that oxide does not form thereon during the formation of the gate oxide 230.

Figure 6:
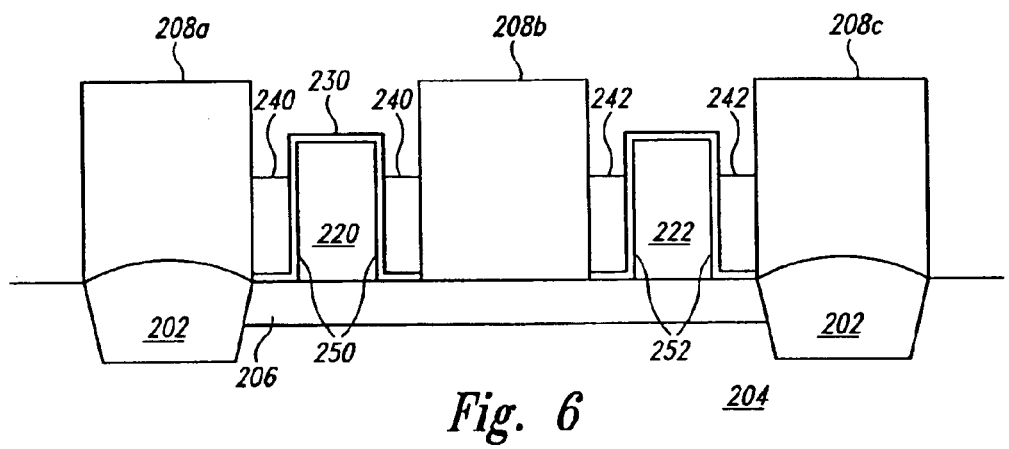
FIG. 6 is a simplified cross-sectional view of the substrate of FIG. 5 at a later point in processing, in accordance with an embodiment of the present invention.

FIG. 6 is a simplified cross-sectional view of the structure shown in FIG. 5 at a later point in processing, in accordance with an embodiment of the present invention. A polysilicon layer is formed over the structure of FIG. 5 followed by a masking and etch process to selectively remove portions of the polysilicon layer. An anisotropic etch back process is then performed to remove additional portions of polysilicon layer in order to form gates 240, 242 of vertical transistors 250, 252, respectively. The etch back process recesses the gates 240, 242 to below the height of the epitaxial posts 220, 222, respectively. Although shown in cross-section in FIG. 6, the gates 240, 242 surround the respective posts 220, 222. This is apparent from FIG. 2A, which illustrates that the gate 242 is part of a continuous polysilicon wordline that is formed around each of the epitaxial posts associated with the memory cells of that row.

Figure 7:
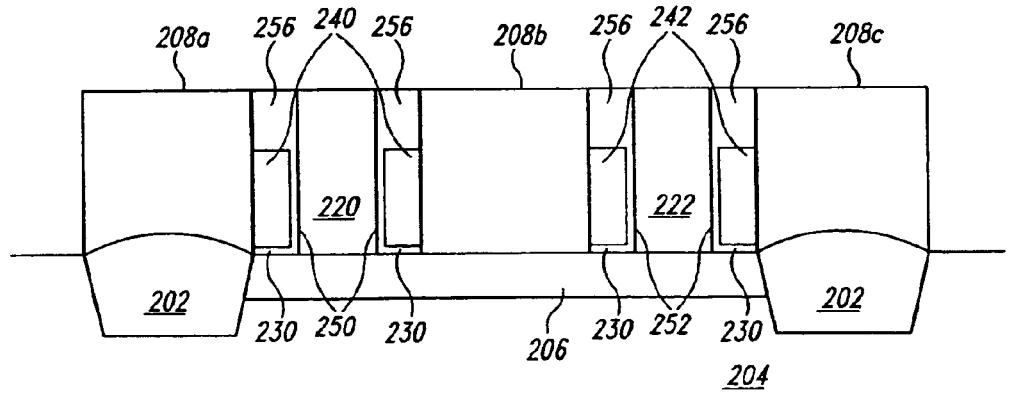
FIG. 7 is a simplified cross-sectional view of the substrate of FIG. 6 at a later point in processing, in accordance with an embodiment of the present invention.

FIG. 7 is a simplified cross-sectional view of the structure shown in FIG. 6 at a later point in processing, in accordance with an embodiment of the present invention. An insulating layer is formed over the structure shown in FIG. 6 and subsequently etched back to form a relatively planar surface. Although a conventional chemical-mechanical polishing process can be used for the etch back step, it will be appreciated that other suitable etch back processes may be used as well. The etch back process results in the formation of insulating spacers 256 to isolate the gates 240, 242 of the vertical transistors 250, 252. The insulating layer 258, and consequently, the insulating spacers 256, can be formed from a silicon oxide material, or other material, that is selective to a silicon nitride etch process.

Figure 8:
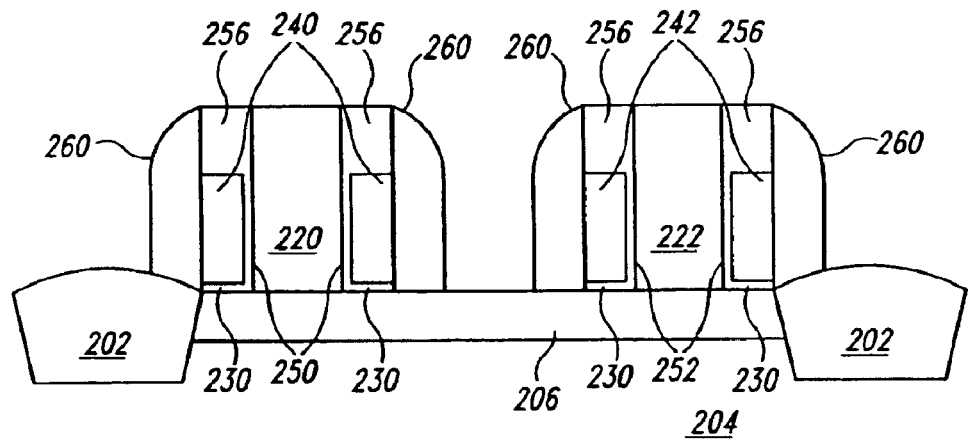
FIG. 8 is a simplified cross-sectional view of the substrate of FIG. 7 at a later point in processing, in accordance with an embodiment of the present invention.

FIG. 8 is a simplified cross-sectional view of the structure shown in FIG. 7 at a later point in processing, in accordance with an embodiment of the present invention. An etch process is used to remove the silicon nitride sacrificial structures 208*a–c* to leave the epitaxial posts 220, 222, the vertical transistors 250, 252, and the insulating spacers 256. An insulating material is then deposited over the remaining structure and anisotropically etched back to form sidewalls 260 that isolate the gates 240, 242 of the vertical transistors 250, 252, respectively. As shown in FIG. 2B, a dielectric interlayer 264 is subsequently deposited over the existing structure and etched back to form a planar surface on which digit lines and storage capacitors can be formed. Still with reference to FIG. 2B, a via 270 is formed through the dielectric interlayer 246 to expose a portion the active region 206. A conductive material 272 is subsequently deposited over the structure and in the via 270 to electrically contact the active region 206. The conductive material 272 is masked and etched to form a digit line contact.

Figure 9:
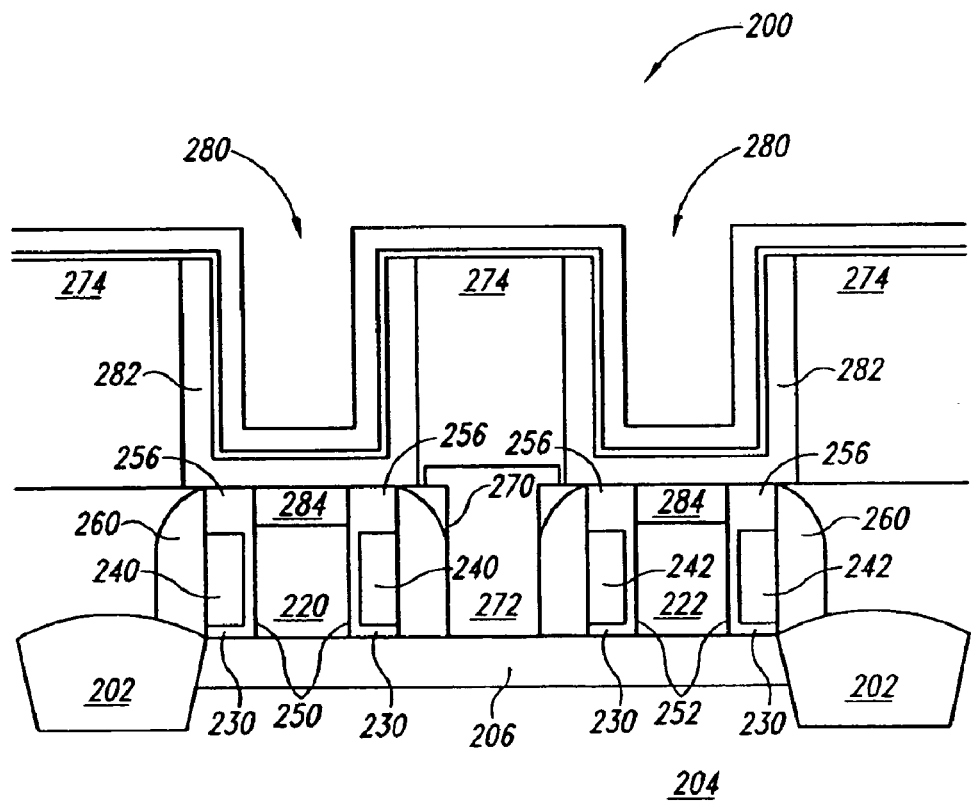
FIG. 9 is a simplified cross-sectional view of the structure of FIG. 2B at a later point in processing, in accordance with an embodiment of the present invention.

FIG. 9 is a simplified cross-sectional view of the structure shown in FIG. 2B at a later point in processing, in accordance with an embodiment of the present invention. A second dielectric interlayer 274 is deposited over the structure, and using conventional methods, container shaped memory cell capacitors 280 are formed in the second dielectric interlayer 274 and have a first capacitor plate 282 electrically coupled to a respective epitaxial post 220, 222. The first capacitor plate 282 can be formed from a highly doped polysilicon material, however, it will be appreciated that other suitable materials may be used as well. Following the formation of the first capacitor plates 282 of the memory cell capacitors 280, dopants from the highly doped polysilicon layer are diffused into the respective epitaxial post 220, 222 by heating the substrate 204. As a result, lightly doped conductive regions 284 are created in the epitaxial posts 220, 222 in a region adjacent the insulating spacers 256. The lightly doped conductive regions 284 provide a conductive path between a memory cell capacitor 280 and the respective gate 240, 242 of the vertical transistors 250, 252. Thus, when a vertical transistor is activated, the memory cell capacitor 280 can be electrically coupled to the active region 206.

Although embodiments of the present invention have been described as including container shaped memory cell capacitors 280, it will be appreciated that alternative capacitor structures can also be used as well without departing from the scope of the present invention. For example, conventional stacked capacitor structures electrically coupled to the epitaxial posts 220, 222 could be used in an alternative embodiment of the present invention. Alternatively, capacitors having a first capacitor plate with multiple polysilicon layers, that is, a "finned" capacitor, could also be used. Moreover, other modifications can be made to the memory cell capacitors 280 as well and still remain within the scope of the present invention. An example of such a modification includes forming memory cell capacitors 280 having a rough surface such as a hemispherical silicon grain (HSG) layer (not shown). Consequently, the present invention is not limited to the specific embodiments described herein.

Figure 10:
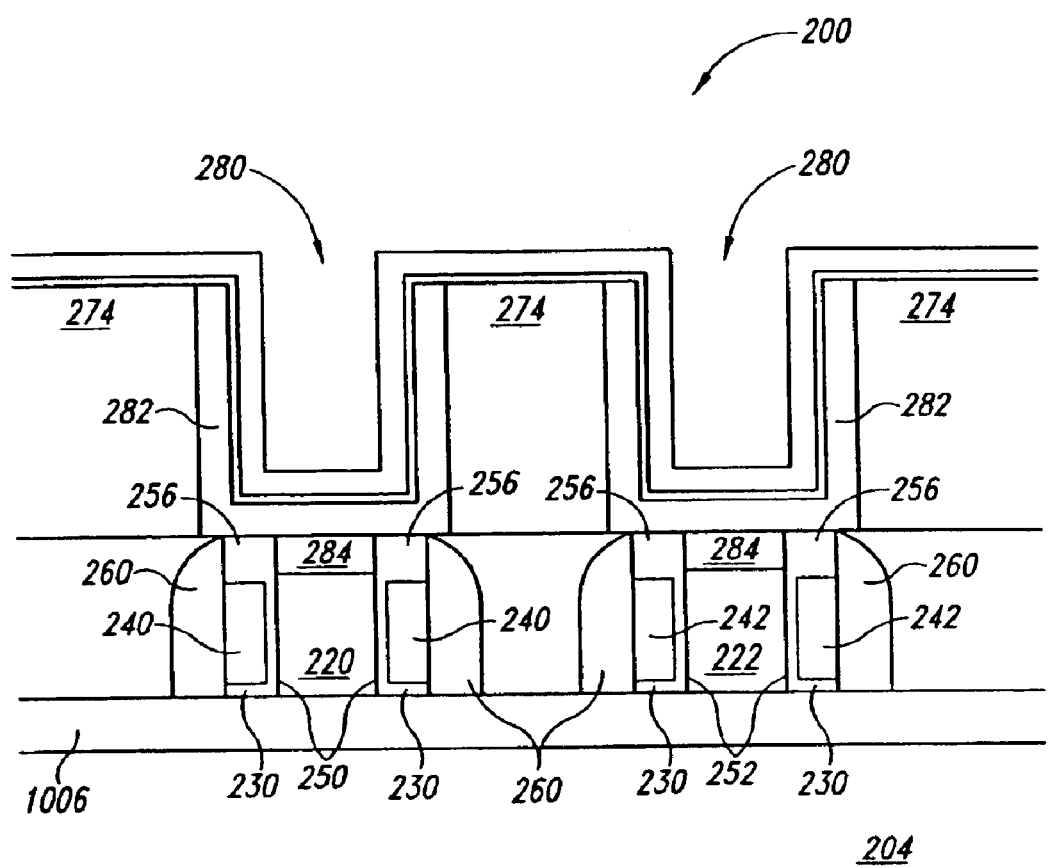
FIG. 10 is a simplified cross-sectional view of a pair of memory cell according to an alternative embodiment.

FIG. 10 illustrates a pair of memory cells 1000 according to an alternative embodiment of the present invention. Whereas memory cells 200 (FIG. 9) includes a digit line contact formed from a conductive material 272, the memory cell 1000 includes a buried digit line 1006. Formation of the buried digit line 1006 is well known in the art and can be formed using conventional processing methods.

It will be appreciated that the description provided herein is sufficient to enable those of ordinary skill in the art to practice the invention. Selecting specific process parameters, including temperature, doping levels, thicknesses, and the like, are well within the understanding of those ordinarily skilled in the art. Particular details such as these have been omitted from herein in order to avoid unnecessarily obscuring the present invention. It will be further appreciated that additional processing steps can be performed in fabricating the memory cells 200 without departing from the scope of the present invention. For example, in forming the isolation regions 202, an implant process can be performed to create a junction region below the isolation region 202 to minimize leakage currents between adjacent active regions. Another example of such a modification is performing an implant step prior to deposition of the conductive material 272 to create a highly doped region in the active region 206 to promote conductivity to the digit line contact.

Figure 11:
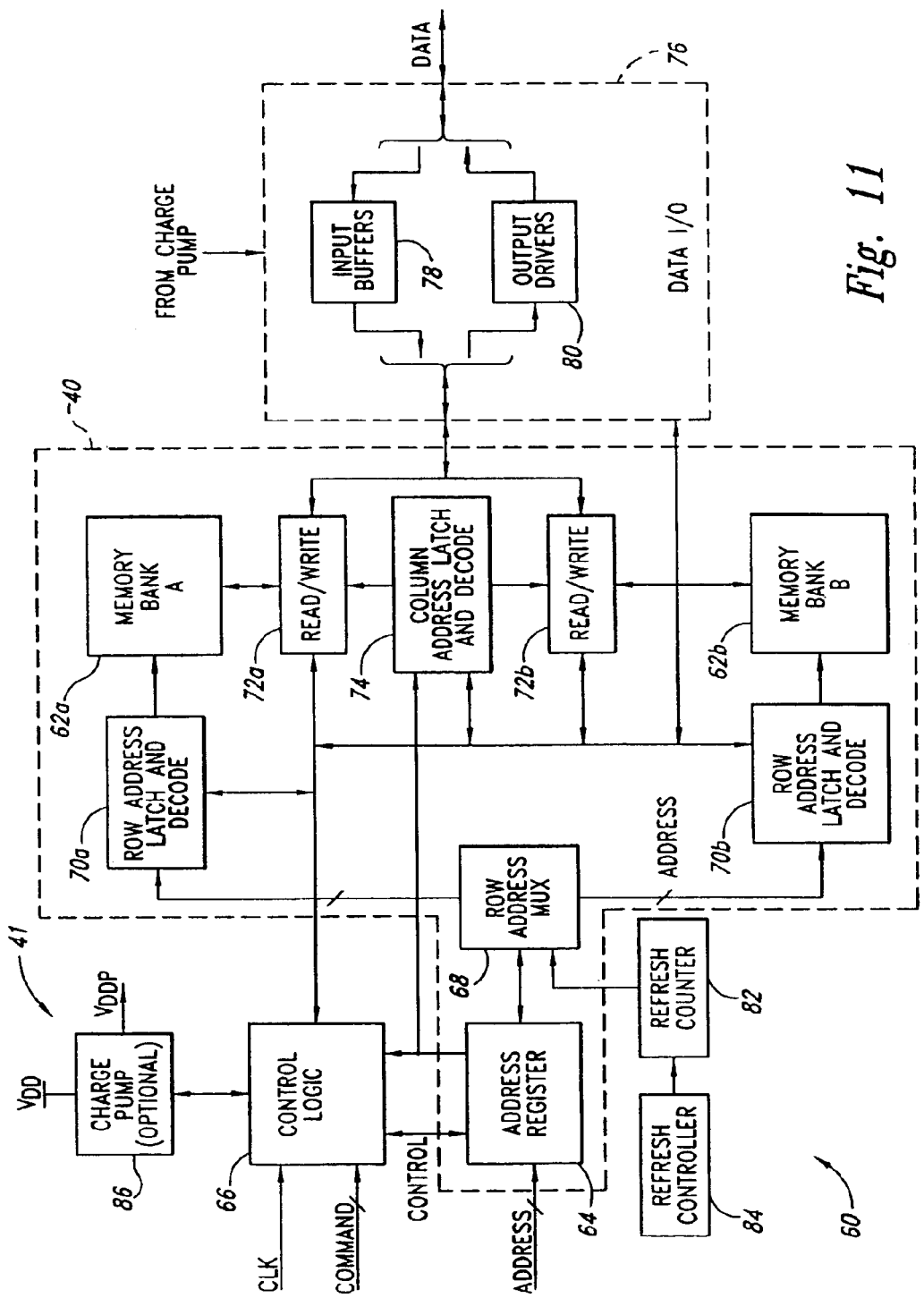
FIG. 11 is a functional block diagram of a memory circuit that includes memory cells according to an embodiment of the present invention.

FIG. 11 is a functional block diagram of one embodiment of a memory circuit 60, which includes memory banks 62a and 62b. These memory banks each incorporate a memory array according to an embodiment of the present invention. In one embodiment, the memory circuit 60 is a synchronous DRAM (SDRAM), although it may be another type of memory in other embodiments.

The memory circuit 60 includes an address register 64, which receives an address from an ADDRESS bus. A control logic circuit 66 receives a clock (CLK) signal receives clock enable (CKE), chip select (CS), row address strobe (RAS), column address strobe (CAS), and write enable (WE) signals from the COMMAND bus, and communicates with the other circuits of the memory device 60. A row-address multiplexer 68 receives the address signal from the address register 64 and provides the row address to the row-address latch-and-decode circuits 70a and 70b for the memory bank 62a or the memory bank 62b, respectively. During read and write cycles, the row-address latch-and-decode circuits 70a and 70b activate the word lines of the addressed rows of memory cells in the memory banks 62a and 62b, respectively. Read/write circuits 72a and 72b read data from the addressed memory cells in the memory banks 62a and 62b, respectively, during a read cycle, and write data to the addressed memory cells during a write cycle. A column-address latch-and-decode circuit 74 receives the address from the address register 64 and provides the column address of the selected memory cells to the read/write circuits 72a and 72b. For clarity, the address register 64, the row-address multiplexer 68, the row-address latch-and-decode circuits 70a and 70b, and the column-address latch-and-decode circuit 74 can be collectively referred to as an address decoder.

A data input/output (I/O) circuit 76 includes a plurality of input buffers 78. During a write cycle, the buffers 78 receive and store data from the DATA bus, and the read/write circuits 72a and 72b provide the stored data to the memory banks 62a and 62b, respectively. The data I/O circuit 76 also includes a plurality of output drivers 80. During a read cycle, the read/write circuits 72a and 72b provide data from the memory banks 62a and 62b, respectively, to the drivers 80, which in turn provide this data to the DATA bus.

A refresh counter 82 stores the address of the row of memory cells to be refreshed either during a conventional auto-refresh mode or self-refresh mode. After the row is refreshed, a refresh controller 84 updates the address in the refresh counter 82, typically by either incrementing or decrementing the contents of the refresh counter 82 by one. Although shown separately, the refresh controller 84 may be part of the control logic 66 in other embodiments of the memory device 60. The memory device 60 may also include an optional charge pump 86, which steps up the power-supply voltage $V_{DD}$ to a voltage $V_{DDP}$. In one embodiment, the pump 86 generates $V_{DDP}$ approximately 1–1.5 V higher than $V_{DD}$. The memory circuit 60 may also use $V_{DDP}$ to conventionally overdrive selected internal transistors.

Figure 12:
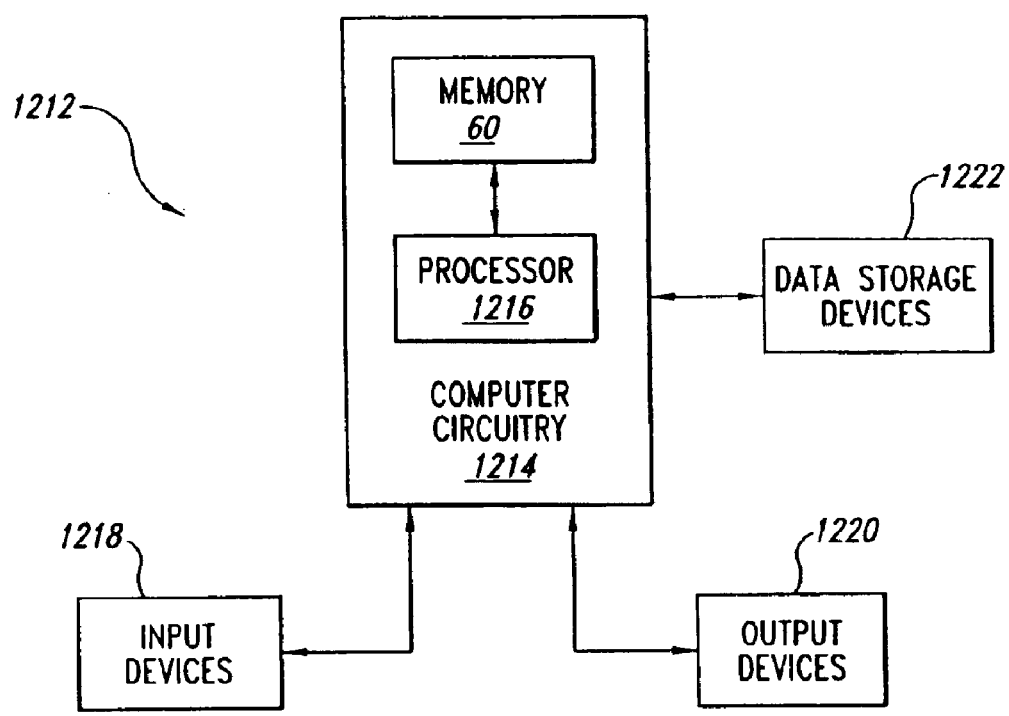
FIG. 12 is a functional block diagram of a computer system including a memory device according to the embodiment shown in FIG. 11.

FIG. 12 is a block diagram of an electronic system 1212, such as a computer system, that incorporates the memory circuit 60 of FIG. 11. The system 1212 also includes computer circuitry 1214 for performing computer functions, such as executing software to perform desired calculations and tasks. The circuitry 1214 typically includes a processor 1216 and the memory circuit 60, which is coupled to the processor 1216. One or more input devices 1218, such as a keyboard or a mouse, are coupled to the computer circuitry 1214 and allow an operator (not shown) to manually input data thereto. One or more output devices 1220 are coupled to the computer circuitry 1214 to provide to the operator data generated by the computer circuitry 1214. Examples of such output devices 1220 include a printer and a video display unit. One or more data-storage devices 1222 are coupled to the computer circuitry 1214 to store data on or retrieve data from external storage media (not shown). Examples of the storage devices 1222 and the corresponding storage media include drives that accept hard and floppy disks, tape cassettes, and compact disk read-only memories (CD-ROMs). Typically, the computer circuitry 1214 includes address data and command buses and a clock line that are respectively coupled to the ADDRESS, DATA, and COMMAND buses, and the CLK line of the memory device 60.

From the foregoing it will be appreciated that, although specific embodiments of the invention have been described herein for purposes of illustration, various modifications may be made without deviating from the spirit and scope of the invention. For example, the memory cell 200 has been illustrated as having epitaxial posts with a rectangular or quadrilateral cross-sectional area. However, the epitaxial posts can be formed having a generally circular cross-sectional area or a generally polygonal cross-sectional area as well. Accordingly, the invention is not limited except as by the appended claims.

What is claimed is:

1. A memory cell formed on a substrate having a surface, comprising:
   an active region formed in the substrate;
   a vertical transistor at least partially formed in an epitaxial post, the epitaxial post formed on the surface of the substrate and extending therefrom, the vertical transistor further having a gate formed around a perimeter of the epitaxial post; and a capacitor formed on the vertical transistor.

2. The memory cell of claim 1, wherein the vertical transistor comprises:

a gate oxide formed on a surface defining the perimeter of the epitaxial post, the gate being formed on the gate oxide; and insulating sidewalls formed on the gate.

3. The memory cell of claim 1, wherein the gate comprises polysilicon.

4. The memory cell of claim 1, wherein the capacitor comprises a container shaped capacitor structure.

5. The memory cell of claim 1, further comprising a diffusion region in the epitaxial post adjacent the capacitor.

6. The memory cell of claim 1, wherein the active region comprises a buried digit line.

7. The memory cell of claim 1, further comprising a digit line contact formed over the active region and proximate the vertical transistor.

8. The memory cell of claim 1, further comprising an insulating region formed around the perimeter of the epitaxial post and interposed between the capacitor and the vertical transistor.

9. The memory cell of claim 1, wherein the epitaxial post comprises a channel region.

10. A memory cell formed on a substrate having a surface, comprising:

a vertical transistor comprising:
an active region formed in the substrate;
an epitaxial post extending from the surface of the substrate; and
a gate formed to substantially extend around a perimeter of the epitaxial post; and a capacitor formed on the vertical transistor.

11. The memory cell of claim 10, wherein the vertical transistor comprises:

a gate oxide formed on a surface defining the perimeter of the epitaxial post, the gate being formed on the gate oxide; and insulating sidewalls formed on the gate.

12. The memory cell of claim 10, wherein the gate comprises polysilicon.

13. The memory cell of claim 10, wherein the capacitor comprises a container shaped capacitor structure.

14. The memory cell of claim 10, further comprising a diffusion region in the epitaxial post adjacent the capacitor.

15. The memory cell of claim 10, wherein the active region comprises a buried digit line.

16. The memory cell of claim 10, further comprising a digit line contact formed over the active region and proximate the vertical transistor.

17. The memory cell of claim 10, further comprising an insulating region formed around the perimeter of the epitaxial post and interposed between the capacitor and the vertical transistor.

18. The memory cell of claim 10, wherein the epitaxial post comprises a channel region.

19. A memory cell comprising:

a vertical transistor comprising:
a first source/drain region formed in the substrate;
a post extending from a surface of the substrate, the post having a second source/drain region formed therein; and
a gate formed from a semiconductor material, the gate formed at least partially around a perimeter of the post; and a capacitor formed on the post.

20. The memory cell of claim 19, wherein the post comprises an epitaxial post.

21. The memory cell of claim 19, wherein the post comprises a channel region.

22. The memory cell of claim 19, wherein the gate extends peripherally about the epitaxial post.

23. A memory cell formed on a substrate having a surface, comprising:

an active region formed in the substrate;
a vertical transistor at least partially formed in an epitaxial post formed on the surface of the substrate over the active region, the vertical transistor having a gate formed at least partially around a perimeter of the epitaxial post; and a capacitor formed on the epitaxial post.

24. The memory cell of claim 23, wherein the vertical transistor comprises:

a gate oxide formed on a surface defining the perimeter of the epitaxial post, the gate being formed on the gate oxide; and insulating sidewalls formed on the gate.

25. The memory cell of claim 24, wherein the gate comprises polysilicon.

26. The memory cell of claim 23, wherein the capacitor comprises a container shaped capacitor structure.

27. The memory cell of claim 23, further comprising a diffusion region in the epitaxial post adjacent the capacitor.

28. The memory cell of claim 23, wherein the active region comprises a buried digit line.

29. The memory cell of claim 23, further comprising a digit line contact formed over the active region and proximate the vertical transistor.

30. The memory cell of claim 23, further comprising an insulating region formed around the perimeter of the epitaxial post and interposed between the capacitor and the vertical transistor.

31. The memory cell of claim 23, wherein the epitaxial post comprises a channel region.

* * * * *